(12) United States Patent
Ho et al.

(10) Patent No.: US 10,181,408 B2
(45) Date of Patent: Jan. 15, 2019

(54) CHEMICAL MECHANICAL POLISHING METHOD FOR TUNGSTEN USING POLYGLYCOLS AND POLYGLYCOL DERIVATIVES

(71) Applicant: Rohm and Haas Electronic Materials CMP Holdings, Inc., Newark, DE (US)

(72) Inventors: Lin-Chen Ho, Taichung (TW); Wei-Wen Tsai, Philadelphia, PA (US); Cheng-Ping Lee, Miaoli County (TW)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 0 days.

(21) Appl. No.: 15/815,292

(22) Filed: Nov. 16, 2017

(65) Prior Publication Data
US 2018/0218918 A1    Aug. 2, 2018

Related U.S. Application Data

(60) Provisional application No. 62/452,796, filed on Jan. 31, 2017.

(51) Int. Cl.
*H01L 21/321* (2006.01)
*C23F 3/06* (2006.01)
*H01L 21/3105* (2006.01)
*C09G 1/02* (2006.01)

(52) U.S. Cl.
CPC ............ *H01L 21/3212* (2013.01); *C09G 1/02* (2013.01); *C23F 3/06* (2013.01); *H01L 21/31053* (2013.01)

(58) Field of Classification Search
CPC . H01L 21/3212; H01L 21/31053; C09G 1/02; C23F 3/06
See application file for complete search history.

(56) References Cited

U.S. PATENT DOCUMENTS

| | | | |
|---|---|---|---|
| 6,974,777 B2 | 12/2005 | Moeggenborg et al. | |
| 2005/0233578 A1* | 10/2005 | Jia | B23H 5/08 438/633 |
| 2005/0282991 A1 | 12/2005 | Bojkova et al. | |
| 2007/0248564 A1 | 10/2007 | Wilson et al. | |
| 2016/0237315 A1* | 8/2016 | Stender | B24B 37/20 |
| 2017/0121561 A1* | 5/2017 | Dockery | B24B 37/24 |

FOREIGN PATENT DOCUMENTS

WO    2015/171423 A1    11/2015

* cited by examiner

*Primary Examiner* — Duy Vu N Deo
*(74) Attorney, Agent, or Firm* — John J. Piskorski

(57) ABSTRACT

A process for chemical mechanical polishing a substrate containing tungsten is disclosed to reduce corrosion rate and inhibit dishing of the tungsten and erosion of underlying dielectrics. The process includes providing a substrate; providing a polishing composition, containing, as initial components: water; an oxidizing agent; a polyglycol or polyglycol derivative; a dicarboxylic acid, a source of iron ions; a colloidal silica abrasive; and, optionally a pH adjusting agent; providing a chemical mechanical polishing pad, having a polishing surface; creating dynamic contact at an interface between the polishing pad and the substrate; and dispensing the polishing composition onto the polishing surface at or near the interface between the polishing pad and the substrate; wherein some of the tungsten (W) is polished away from the substrate, corrosion rate is reduced, dishing of the tungsten (W) is inhibited as well as erosion of dielectrics underlying the tungsten (W).

4 Claims, No Drawings

CHEMICAL MECHANICAL POLISHING METHOD FOR TUNGSTEN USING POLYGLYCOLS AND POLYGLYCOL DERIVATIVES

FIELD OF THE INVENTION

The present invention is directed to the field of chemical mechanical polishing of tungsten to inhibit dishing of the tungsten in combination with inhibiting erosion of underlying dielectrics and to reduce corrosion rate using a polyglycol or polyglycol derivative. More specifically, the present invention is directed to a method for chemical mechanical polishing of tungsten to inhibit dishing of the tungsten in combination with inhibiting erosion of underlying dielectrics and to reduce corrosion rate by providing a substrate containing tungsten; providing a polishing composition, containing, as initial components: water; an oxidizing agent; a polyglycol or polyglycol derivative; a dicarboxylic acid, a source of iron ions; a colloidal silica abrasive; and, optionally a pH adjusting agent; providing a chemical mechanical polishing pad, having a polishing surface; creating dynamic contact at an interface between the polishing pad and the substrate; and dispensing the polishing composition onto the polishing surface at or near the interface between the polishing pad and the substrate where some of the tungsten is polished away from the substrate.

BACKGROUND OF THE INVENTION

In the fabrication of integrated circuits and other electronic devices, multiple layers of conducting, semiconducting and dielectric materials are deposited on or removed from a surface of a semiconductor wafer. Thin layers of conducting, semiconducting, and dielectric materials may be deposited by a number of deposition techniques. Common deposition techniques in modern processing include physical vapor deposition (PVD), also known as sputtering, chemical vapor deposition (CVD), plasma-enhanced chemical vapor deposition (PECVD), and electrochemical plating (ECP).

As layers of materials are sequentially deposited and removed, the uppermost surface of the wafer becomes non-planar. Because subsequent semiconductor processing (e.g., metallization) requires the wafer to have a flat surface, the wafer needs to be planarized. Planarization is useful in removing undesired surface topography and surface defects, such as rough surfaces, agglomerated materials, crystal lattice damage, scratches, and contaminated layers or materials.

Chemical mechanical planarization, or chemical mechanical polishing (CMP), is a common technique used to planarize substrates, such as semiconductor wafers. In conventional CMP, a wafer is mounted on a carrier assembly and positioned in contact with a polishing pad in a CMP apparatus. The carrier assembly provides a controllable pressure to the wafer, pressing it against the polishing pad. The pad is moved (e.g., rotated) relative to the wafer by an external driving force. Simultaneously therewith, a polishing composition ("slurry") or other polishing solution is provided between the wafer and the polishing pad. Thus, the wafer surface is polished and made planar by the chemical and mechanical action of the pad surface and slurry.

Substrates in the electronics industry possess a high degree of integration where semiconductor bases include multilayers of interconnected structures. The layers and the structures include a wide variety of materials such as single crystal silicon, polycrystalline silicon, tetraethyl orthosilicate, silicon dioxide, silicon nitride, tungsten, titanium, titanium nitride and various other conductive, semiconductive and dielectric materials. Because these substrates require various processing steps, including CMP to form a final multilayered interconnected structure, it is often highly desirable to utilize polishing compositions and processes that are selective for specific materials depending on the intended applications. Unfortunately, such polishing compositions can cause excessive dishing of the conductive material which can lead to erosion of dielectric material. The topographical defects which can result from such dishing and erosion can further lead to non-uniform removal of additional materials from the substrate surface, such as barrier layer material disposed beneath the conductive material or dielectric material and produce a substrate surface having less than desirable quality which can negatively impact the performance of the integrated circuit.

Chemical mechanical polishing has become a preferred method for polishing tungsten during the formation of tungsten interconnects and contact plugs in integrated circuit designs. Tungsten is frequently used in integrated circuit designs for contact/via plugs. Typically, a contact or via hole is formed through a dielectric layer on a substrate to expose regions of an underlying component, for example, a first level metallization or interconnect. Unfortunately, many CMP slurries used to polish tungsten cause the problem of dishing. The severity of the dishing can vary but it typically is severe enough to cause erosion of underlying dielectric materials such as TEOS.

Another problem associated with polishing metals such as tungsten is corrosion. The corrosion of metals is a common side-effect of CMP. During the CMP process the metal polishing slurry that remains on the surface of the substrate continues to corrode the substrate beyond the effects of the CMP. Sometimes corrosion is desired; however, in most semiconductor processes corrosion is to be reduced or inhibited. Corrosion may also contribute to surface defects such as pitting and key-holing. These surface defects significantly affect the final properties of the semiconductor device and hamper its usefulness. Therefore, there is a need for a CMP polishing method and composition for tungsten which inhibits dishing of tungsten and erosion of underlying dielectric materials such as TEOS and also reduces corrosion rate.

SUMMARY OF THE INVENTION

The present invention provides a method of chemical mechanical polishing tungsten, comprising: providing a substrate comprising tungsten and a dielectric; providing a chemical mechanical polishing composition, comprising, as initial components: water; an oxidizing agent; a polyglycol or polyglycol derivative in amounts of at least 50 ppm; a colloidal silica abrasive; a dicarboxylic acid or salt thereof; a source of iron (III) ions; and, optionally, a pH adjusting agent; providing a chemical mechanical polishing pad, having a polishing surface; creating dynamic contact at an interface between the chemical mechanical polishing pad and the substrate; and dispensing the chemical mechanical polishing composition onto the polishing surface of the chemical mechanical polishing pad at or near the interface between the chemical mechanical polishing pad and the substrate; wherein some of the tungsten is polished away from the substrate.

The present invention provides a chemical mechanical method of polishing tungsten, comprising: providing the substrate comprising tungsten and a dielectric; providing a chemical mechanical polishing composition, comprising, as initial components: water; an oxidizing agent; a polyglycol or a polyglycol derivative in amounts of 50 ppm to 1000 ppm; a colloidal silica abrasive; a dicarboxylic acid or salt thereof; a source of iron (III) ions; and, optionally, a pH adjusting agent; providing a chemical mechanical polishing pad, having a polishing surface; creating dynamic contact at an interface between the chemical mechanical polishing pad and the substrate; and dispensing the chemical mechanical polishing composition onto the polishing surface of the chemical mechanical polishing pad at or near the interface between the chemical mechanical polishing pad and the substrate; wherein some of the tungsten is polished away from the substrate; wherein the chemical mechanical polishing composition provided has a tungsten removal rate of ≥1,000 Å/min with a platen speed of 80 revolutions per minute, a carrier speed of 81 revolutions per minute, a chemical mechanical polishing composition flow rate of 125 mL/min, a nominal down force of 21.4 kPa on a 200 mm polishing machine; and, wherein the chemical mechanical polishing pad comprises a polyurethane polishing layer containing polymeric hollow core microparticles and a polyurethane impregnated non-woven subpad.

The present invention provides a chemical mechanical method of polishing tungsten, comprising: providing a substrate comprising tungsten and a dielectric; providing a chemical mechanical polishing composition, comprising, as initial components: water; an oxidizing agent; a polyglycol or polyglycol derivative in an amount of 50 ppm to 800 ppm; a colloidal silica abrasive; malonic acid or salt thereof; a source of iron (III) ions; and, optionally, a pH adjusting agent; providing a chemical mechanical polishing pad, having a polishing surface; creating dynamic contact at an interface between the chemical mechanical polishing pad and the substrate; and dispensing the chemical mechanical polishing composition onto the polishing surface of the chemical mechanical polishing pad at or near the interface between the chemical mechanical polishing pad and the substrate; wherein some of the tungsten is polished away from the substrate; wherein the chemical mechanical polishing composition provided has a tungsten removal rate of ≥1,000 Å/min with a platen speed of 80 revolutions per minute, a carrier speed of 81 revolutions per minute, a chemical mechanical polishing composition flow rate of 125 mL/min, a nominal down force of 21.4 kPa on a 200 mm polishing machine; wherein the chemical mechanical polishing pad comprises a polyurethane polishing layer containing polymeric hollow core microparticles and a polyurethane impregnated non-woven subpad.

The present invention provides a method of chemical mechanical polishing tungsten, comprising: providing the substrate comprising tungsten and a dielectric; providing a chemical mechanical polishing composition, comprising, as initial components: water; 0.01 to 10 wt % of an oxidizing agent, wherein the oxidizing agent is hydrogen peroxide; 100 ppm to 500 ppm of a polyglycol or polyglycol derivative; 0.01 to 10 wt % of a colloidal silica abrasive; 100 to 1,400 ppm malonic acid or salt thereof; 100 to 1,000 ppm of a source of iron (III) ions, wherein the source of iron (III) ions is ferric nitrate nonahydrate; and, optionally, a pH adjusting agent; wherein the chemical mechanical polishing composition has a pH of 1 to 7; providing a chemical mechanical polishing pad, having a polishing surface; creating dynamic contact at an interface between the chemical mechanical polishing pad and the substrate; and dispensing the chemical mechanical polishing composition onto the polishing surface of the chemical mechanical polishing pad at or near the interface between the chemical mechanical polishing pad and the substrate; wherein some of the tungsten is polished away from the substrate.

The present invention provides a method of chemical mechanical polishing tungsten, comprising: providing a substrate comprising tungsten and a dielectric; providing a chemical mechanical polishing composition, comprising, as initial components: water; 1 to 3 wt % of an oxidizing agent, wherein the oxidizing agent is hydrogen peroxide; 50 to 500 ppm of a polyglycol or polyglycol derivative, 0.2 to 5 wt % of a colloidal silica abrasive; 120 to 1,350 ppm of malonic acid; 250 to 400 ppm of a source of iron (III) ions, wherein the source of iron (III) ions is ferric nitrate nonahydrate; and, optionally, a pH adjusting agent; wherein the chemical mechanical polishing composition has a pH of 2 to 3; providing a chemical mechanical polishing pad, having a polishing surface; creating dynamic contact at an interface between the chemical mechanical polishing pad and the substrate; and dispensing the chemical mechanical polishing composition onto the polishing surface of the chemical mechanical polishing pad at or near the interface between the chemical mechanical polishing pad and the substrate; wherein some of the tungsten is polished away from the substrate.

The foregoing methods of the present invention use a chemical mechanical polishing composition comprising a polyglycol or polyglycol derivative in certain amounts to polish tungsten and inhibit dishing of the tungsten in combination with inhibiting erosion of underlying dielectrics. The method also reduces corrosion rate.

DETAILED DESCRIPTION OF THE INVENTION

As used throughout this specification the following abbreviations have the following meanings, unless the context indicates otherwise: ° C.=degrees Centigrade; g=grams; L=liters; mL=milliliters; µ=µm=microns; kPa=kilopascal; Å=angstroms; mV=millivolts; DI=deionized; ppm=parts per million=mg/L; mm=millimeters; cm=centimeter; min=minute; rpm=revolutions per minute; lbs=pounds; kg=kilograms; W=tungsten; HO=hydroxyl; PO=propylene oxide; EO=ethylene oxide; PEG=polyethylene glycol; Mw=weight average molecular weight in g/mole; ICP-OES=inductively coupled plasma optical emission spectroscopy; PS=polishing slurry; CS=control slurry; wt %=percent by weight; and RR=removal rate.

The term "chemical mechanical polishing" or "CMP" refers to a process where a substrate is polished by means of chemical and mechanical forces alone and is distinguished from electrochemical-mechanical polishing (ECMP) where an electric bias is applied to the substrate. The term "TEOS" means the silicon dioxide formed from tetraethyl orthosilicate ($Si(OC_2H_5)_4$). The term "polyglycol" means an organic compound having more than one ether linkage that yields one or more glycols on hydrolysis of the ether linkages. The term "polyglycol derivative" means an organic compound derived from a polyglycol where one or more hydrogen atoms of the polyglycol are replaced with an organic functional moiety. The term "alkyl" means an organic group with a general formula: $C_nH_{2n+1}$ where "n" is an integer and the "yl" ending means a fragment of an alkane formed by removing a hydrogen. The "———" in a formula or moiety indicates a chemical bond. The term "moiety" means a part or a functional group of a molecule. The terms "a" and "an" refer to both the singular and the plural. All percentages are by weight, unless otherwise noted. All numerical ranges are inclusive and combinable in any order, except where it is logical that such numerical ranges are constrained to add up to 100%.

The method of polishing a substrate of the present invention uses a chemical mechanical polishing composition containing an oxidizing agent; a polyglycol or a polyglycol derivative in amounts of 50 ppm or greater; a colloidal silica abrasive; a dicarboxylic acid or salt thereof; a source of iron (III) ions; water; and, optionally, a pH adjusting agent to provide for the removal of tungsten from the substrate surface while inhibiting dishing of the tungsten, erosion of underlying dielectric materials and reducing corrosion rate.

Preferably, the polyglycols and polyglycol derivatives of the present invention have a general formula:

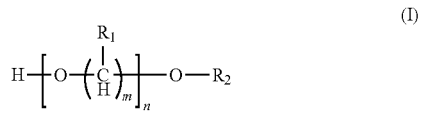
(I)

wherein $R_1$ is hydrogen or a linear or branched $(C_1-C_4)$alkyl, preferably $R_1$ is hydrogen or $(C_1-C_2)$alkyl, more preferably $R_1$ is hydrogen; m and n are integers, wherein m is an integer of 2 to 4, preferably m is 2 to 3, more preferably m is 2, n is an integer of 3 or greater, preferably n is an integer of 3 to 200, more preferably n is an integer of 3 to 150, still more preferably n is an integer of 3 to 100, even more preferably n is an integer of 3 to 50, and when m is 2, it is preferred that $R_1$ is hydrogen or $(C_1-C_2)$alkyl, more preferably $R_1$ is hydrogen or methyl, most preferably $R_1$ is hydrogen when m is 2; $R_2$ is hydrogen, or a linear or branched $(C_1-C_{20})$alkyl, or $R_2$ is a moiety having a formula:

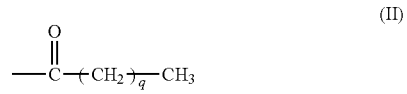
(II)

wherein q is an integer of 1 or greater, preferably q is an integer of 10 to 20, more preferably q is an integer of 12 to 20, still more preferably q is an integer of 15 to 16, or $R_2$ is a moiety having a formula:

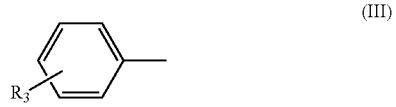
(III)

wherein $R_3$ is linear or branched $(C_1-C_{20})$alkyl, preferably $R_3$ is linear or branched $(C_1-C_{15})$alkyl, more preferably $R_3$ is linear or branched $(C_2-C_{10})$alkyl, or $R_2$ is a moiety having a general formula:

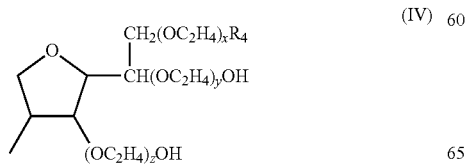
(IV)

wherein $R_4$ is a fatty acid having from 10 to 20 carbon atoms, preferably from 12 to 18 carbon atoms, more preferably $R_4$ is lauric acid or oleic acid moiety and still more preferably $R_4$ is oleic acid moiety, and x, y and z are integers wherein the sum equals 20. Preferably $R_2$ is hydrogen, or the moiety having formula (II) or the moiety having formula (IV), more preferably $R_2$ is hydrogen or the moiety having formula (II), even more preferably $R_2$ is hydrogen, or the moiety having formula (II) and wherein q is an integer of 15 to 16, still more preferably $R_2$ is hydrogen, or the moiety of formula (II) and wherein q is 16, and most preferably $R_2$ is hydrogen.

Preferred polyglycols of the present invention are polyethylene glycols and polypropylene glycols having weight average molecular weights in g/mole of 150 and greater, preferably 200 and greater, more preferably from 200 to 100,000, still more preferably from 200 to 20,000, even more preferably from 200 to 10,000 and further still more preferably from 200 to 1000. It is most preferred that the polyglycols are polyethylene glycols having a weight average molecular weight in g/mole of 200 to 100,000, more preferably from 200 to 10,000. Preferred polyglycols also include random EO/PO copolymers with weight average weight molecular weights in g/mole of greater than 1000, preferably greater than 10,000 and more preferably greater than 50,000.

Examples of preferred polyglycol derivatives are polyalkylene glycol esters. Examples of preferred polyalkylene glycol esters are polyethylene glycol monostearate compounds having a general formula:

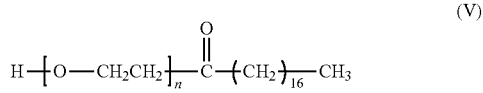
(V)

wherein n is an integer from 10 to 100, preferably from 10 to 50.

Examples of preferred polyglycol derivatives also are polyoxyethylene sorbitan fatty acid esters (polysorbate compounds) wherein $R_2$ is moiety (IV) above. Examples of such esters are polyoxyethylenesorbitan monolaurate, polyoxyethylenesorbitan monopalmitate, polyoxyethylenesorbitan monostearate and polyoxyethylenesorbitan monooleate.

The polyglycol and polyglycol derivatives can be prepared by methods known in the art and literature. Many of the polyglycol and polyglycol derivatives can be commercially obtained such as from SIGMA-ALDRICH®.

Optionally, the chemical mechanical polishing compositions of the present invention include polystyrenesulfonates or derivatives thereof. Polystyrenesulfonates are compounds which include a moiety in their structure having a general formula:

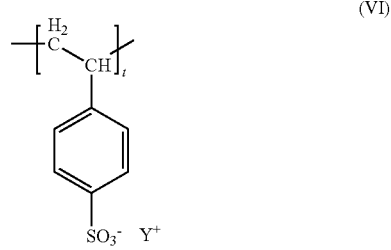
(VI)

wherein t is an integer of 2 or greater and $Y^+$ is $H^+$ or an alkali metal ion such as $Na^+$ or $K^+$. A preferred example of a polystyrene sulfonate derivative is poly(3,4-ethylenedioxythiophene)-poly(styrenesulfonate). Preferably polystyrene sulfonates and derivatives thereof are included in chemical mechanical polishing compositions containing polyethylene glycols. Preferably the polystyrene sulfonates and derivatives thereof are included in chemical mechanical polishing compositions of the present invention wherein the chemical mechanical polishing compositions include polyethylene glycols and colloidal silica abrasives having a (−) zeta potential. Preferably the polystyrene sulfonates and polystyrene sulfonate derivatives are included in amounts of 100 ppm or greater, more preferably from 100 ppm to 3000 ppm, even more preferably from 200 ppm to 2500 ppm.

Preferably, the method of polishing a substrate of the present invention, comprises: providing the substrate, wherein the substrate comprises tungsten and a dielectric; providing a chemical mechanical polishing composition, comprising, preferably, consisting of, as initial components: water; an oxidizing agent, preferably in amounts of at least 0.01 wt % to 10 wt %, more preferably in amounts of 0.1 wt % to 5 wt %, still more preferably from 1 wt % to 3 wt %; a polyglycol or polyglycol derivative in amounts of at least 50 ppm, preferably 50 ppm to 1000 ppm, more preferably from 50 ppm to 800 ppm, even more preferably from 100 ppm to 500 ppm; a colloidal silica abrasive having a positive or negative zeta potential, preferably in amounts of 0.01 wt % to 10 wt %, more preferably from 0.05 wt % to 7.5 wt %, even more preferably from 0.1 wt % to 5 wt %, still more preferably from 0.2 wt % to 5 wt %, most preferably from 0.2 wt % to 2 wt %; a dicarboxylic acid, salt thereof or mixtures thereof, preferably in amounts of 100 ppm to 1400 ppm, more preferably from 120 ppm to 1350 ppm; a source of iron (III) ions, preferably, wherein the source of iron (III) ions is ferric nitrate nonahydrate; and, optionally, a pH adjusting agent; preferably, wherein the chemical mechanical polishing composition has a pH of 1 to 7; more preferably, of 1.5 to 4.5; still more preferably, 1.5 to 3.5; still even more preferably, of 2 to 3, most preferably, of 2 to 2.5; providing a chemical mechanical polishing pad, having a polishing surface; creating dynamic contact at an interface between the chemical mechanical polishing pad and the substrate; and dispensing the chemical mechanical polishing composition onto the polishing surface of the chemical mechanical polishing pad at or near the interface between the chemical mechanical polishing pad and the substrate; wherein at least some of the tungsten is polished away from the substrate.

Preferably, in the method of polishing a substrate of the present invention, the substrate comprises tungsten and a dielectric. More preferably, the substrate provided is a semiconductor substrate comprising tungsten and a dielectric. Most preferably, the substrate provided is a semiconductor substrate comprising tungsten deposited within at least one of holes and trenches formed in a dielectric such as TEOS. Preferably the substrate is free of nickel phosphorous.

Preferably, in the method of polishing a substrate of the present invention, the water contained, as an initial component, in the chemical mechanical polishing composition provided is at least one of deionized and distilled to limit incidental impurities.

Preferably, in the method of polishing a substrate of the present invention, the chemical mechanical polishing composition provided contains, as an initial component, an oxidizing agent, wherein the oxidizing agent is selected from the group consisting of hydrogen peroxide ($H_2O_2$), monopersulfates, iodates, magnesium perphthalate, peracetic acid and other per-acids, persulfate, bromates, perbromate, persulfate, peracetic acid, periodate, nitrates, iron salts, cerium salts, Mn (III), Mn (IV) and Mn (VI) salts, silver salts, copper salts, chromium salts, cobalt salts, halogens, hypochlorites and a mixture thereof. More preferably, the oxidizing agent is selected from hydrogen peroxide, perchlorate, perbromate; periodate, persulfate and peracetic acid. Most preferably, the oxidizing agent is hydrogen peroxide.

Preferably, in the method of polishing a substrate of the present invention, the chemical mechanical polishing composition provided contains, as an initial component, 0.01 to 10 wt %, more preferably, 0.1 to 5 wt %; most preferably, 1 to 3 wt % of an oxidizing agent.

Preferably, in the method of polishing a substrate of the present invention, the chemical mechanical polishing composition provided contains, as an initial component, a source of iron (III) ions. More preferably, in the method of the present invention, the chemical mechanical polishing composition provided contains, as an initial component, a source of iron (III) ions, wherein the source of iron (III) ions is selected from the group consisting iron (III) salts. Most preferably, in the method of the present invention, the chemical mechanical polishing composition provided contains, as an initial component, a source of iron (III) ions, wherein the source of iron (III) ions is ferric nitrate nonahydrate, ($Fe(NO_3)_3 \cdot 9H_2O$).

Preferably, in the method of polishing a substrate of the present invention, the chemical mechanical polishing composition provided contains, as an initial component, a source of iron (III) ions sufficient to introduce 1 to 200 ppm, preferably, 5 to 150 ppm, more preferably, 7.5 to 125 ppm, most preferably, 10 to 100 ppm of iron (III) ions to the chemical mechanical polishing composition. It is particularly preferred that the source of iron (III) is included to introduce 10 to 150 ppm of iron (III) to the chemical mechanical polishing composition.

Preferably, in the method of polishing a substrate of the present invention, the chemical mechanical polishing composition provided contains, as an initial component, a source of iron (III) ions. More preferably, in the method of polishing a substrate of the present invention, the chemical mechanical polishing composition provided contains, as an initial component, 100 to 1,000 ppm, preferably, 150 to 750 ppm, more preferably, 200 to 500 ppm and most preferably, 250 to 400 ppm of a source of iron (III) ions. Most preferably, in the method of polishing a substrate of the present invention, the chemical mechanical polishing composition provided contains, as an initial component, 100 to 1,000 ppm, preferably, 150 to 750 ppm, more preferably, 200 to 500 ppm, most preferably, 250 to 400 ppm of a source of iron (III) ions, wherein the source of iron (III) ions is ferric nitrate nonahydrate, ($Fe(NO_3)_3 \cdot 9H_2O$).

Preferably, in the method of polishing a substrate of the present invention, the chemical mechanical polishing composition provided contains, as an initial component, a polyglycol or polyglycol derivative. Preferably, in the method of polishing a substrate of the present invention, the chemical mechanical polishing composition provided contains, as an initial component, at least 50 ppm, preferably 50 ppm to 1000 ppm, more preferably from 50 ppm to 800 ppm, even more preferably from 100 ppm to 500 ppm of a polyglycol or polyglycol derivative.

Preferably, in the method of polishing a substrate of the present invention, the chemical mechanical polishing composition provided contains a colloidal silica abrasive having a positive or a negative zeta potential. More preferably, in the method of polishing a substrate of the present invention, the chemical mechanical polishing composition provided contains a colloidal silica abrasive having a permanent negative zeta potential, wherein the chemical mechanical polishing composition has a pH of 1 to 7, preferably, of 1.5 to 4.5; more preferably, of 1.5 to 3.5; still more preferably, of 2 to 3, most preferably from 2 to 2.5. Still more preferably, in the method of polishing a substrate of the present invention, the chemical mechanical polishing composition provided contains a colloidal silica abrasive having a permanent negative zeta potential, wherein the chemical mechanical polishing composition has a pH of 1 to 7, preferably, of 1.5 to 4.5; more preferably, of 1.5 to 3.5; still more preferably, of 2 to 3, most preferably of 2 to 2.5 as indicated by a zeta potential from −0.1 mV to −20 mV.

Preferably, in the method of polishing a substrate of the present invention, the chemical mechanical polishing composition provided contains, as an initial component, a colloidal silica abrasive, wherein the colloidal silica abrasive has an average particle size ≤100 nm, preferably, 5 to 100 nm; more preferably, 10 to 60 nm; most preferably, 20 to 60 nm as measured by dynamic light scattering techniques.

Preferably, in the method of polishing a substrate of the present invention, the chemical mechanical polishing composition provided contains 0.01 to 10 wt %, preferably 0.05 to 7.5 wt %, more preferably, 0.1 to 5 wt %, still more preferably, 0.2 to 5 wt %, most preferably, 0.2 to 2 wt % of a colloidal silica abrasive. Preferably the colloidal silica abrasive has a negative zeta potential.

Preferably, in the method of polishing a substrate of the present invention, the chemical mechanical polishing composition provided contains, as an initial component, a dicarboxylic acid, wherein the dicarboxylic acid includes, but is not limited to malonic acid, oxalic acid, succinic acid, adipic acid, maleic acid, malic acid, glutaric acid, tartaric acid, salts thereof or mixtures thereof. More preferably, in the method of polishing a substrate of the present invention, the chemical mechanical polishing composition provided contains, as an initial component, a dicarboxylic acid, wherein the dicarboxylic acid is selected from the group consisting of malonic acid, oxalic acid, succinic acid, tartaric acid, salts thereof and mixtures thereof. Still more preferably the chemical mechanical polishing composition provided contains, as an initial component, a dicarboxylic acid, wherein the dicarboxylic acid is selected from the group consisting of malonic acid, oxalic acid, succinic acid, salts thereof and mixtures thereof. Most preferably in the method of polishing a substrate of the present invention, the chemical mechanical polishing composition provided contains, as an initial component, the dicarboxylic acid malonic acid or salts thereof.

Preferably, in the method of polishing a substrate of the present invention, the chemical mechanical polishing composition provided contains, as an initial component, 1 to 2,600 ppm, preferably, 100 to 1,400 ppm, more preferably, 120 to 1,350 ppm, still more preferably, 130 to 1,100 ppm, of a dicarboxylic acid, wherein the dicarboxylic acid includes, but is not limited to malonic acid, oxalic acid, succinic acid, adipic acid, maleic acid, malic acid, glutaric acid, tartaric acid, salts thereof or mixtures thereof. More preferably, in the method of polishing a substrate of the present invention, the chemical mechanical polishing composition provided contains, as an initial component, 1 to 2,600 ppm of malonic acid, salt thereof or mixtures thereof. Most preferably, in the method of polishing a substrate of the present invention, the chemical mechanical polishing composition provided contains, as an initial component 100 to 1,400 ppm, more preferably, 120 to 1,350 ppm, still more preferably, 130 to 1,350 ppm, the dicarboxylic acid malonic acid or salts thereof.

Preferably, in the method of polishing a substrate of the present invention, the chemical mechanical polishing composition provided has a pH of 1 to 7. More preferably, in the method of polishing a substrate of the present invention, the chemical mechanical polishing composition provided has a pH of 1.5 to 4.5. Still more preferably, in the method of polishing a substrate of the present invention, the chemical mechanical polishing composition provided has a pH of 1.5 to 3.5. Still even more preferably, in the method of polishing a substrate of the present invention, the chemical mechanical polishing composition provided has a pH of 2 to 3. Most preferably, in the method of polishing a substrate of the present invention, the chemical mechanical polishing composition provided has a pH of 2 to 2.5.

Preferably, in the method of polishing a substrate of the present invention, the chemical mechanical polishing composition provided optionally contains a pH adjusting agent. Preferably, the pH adjusting agent is selected from the group consisting of inorganic and organic pH adjusting agents. Preferably, the pH adjusting agent is selected from the group consisting of inorganic acids and inorganic bases. More preferably, the pH adjusting agent is selected from the group consisting of nitric acid and potassium hydroxide. Most preferably, the pH adjusting agent is potassium hydroxide.

Preferably, in the method of polishing a substrate of the present invention, the chemical mechanical polishing pad provided can by any suitable polishing pad known in the art. One of ordinary skill in the art knows to select an appropriate chemical mechanical polishing pad for use in the method of the present invention. More preferably, in the method of polishing a substrate of the present invention, the chemical mechanical polishing pad provided is selected from woven and non-woven polishing pads. Still more preferably, in the method of polishing a substrate of the present invention, the chemical mechanical polishing pad provided comprises a polyurethane polishing layer. Most preferably, in the method of polishing a substrate of the present invention, the chemical mechanical polishing pad provided comprises a polyurethane polishing layer containing polymeric hollow core microparticles and a polyurethane impregnated non-woven subpad. Preferably, the chemical mechanical polishing pad provided has at least one groove on the polishing surface.

Preferably, in the method of polishing a substrate of the present invention, the chemical mechanical polishing composition provided is dispensed onto a polishing surface of the chemical mechanical polishing pad provided at or near an interface between the chemical mechanical polishing pad and the substrate.

Preferably, in the method of polishing a substrate of the present invention, dynamic contact is created at the interface between the chemical mechanical polishing pad provided and the substrate with a down force of 0.69 to 34.5 kPa normal to a surface of the substrate being polished.

Preferably, in the method of polishing a substrate of the present invention, wherein the chemical mechanical polishing composition provided has a tungsten removal rate ≥1,000 Å/min; preferably, ≥1,500 Å/min; more preferably, ≥2,000 Å/min. More preferably, in the method of polishing a substrate of the present invention, wherein the chemical mechanical polishing composition provided has a tungsten removal rate of ≥1,000 Å/min; preferably, ≥1,500 Å/min; more preferably, ≥2,000 Å/min; and a W/TEOS selectivity of ≥5. Still more preferably, in the method of polishing a substrate of the present invention, wherein the tungsten is removed from the substrate at a removal rate of ≥1,000 Å/min; preferably, ≥1,500 Å/min; more preferably, ≥2,000 Å/min; and a W/TEOS selectivity of 5 to 15. Most preferably, in the method of polishing the substrate of the present invention, wherein the tungsten is removed from the substrate at a removal rate of ≥1,000 Å/min; preferably, ≥1,500 Å/min; more preferably, ≥2,000 Å/min; and a W/TEOS selectivity of 6 to 14 and with a platen speed of 80 revolutions per minute, a carrier speed of 81 revolutions per minute, a chemical mechanical polishing composition flow rate of 125 mL/min, a nominal down force of 21.4 kPa on a 200 mm polishing machine; and, wherein the chemical mechanical polishing pad comprises a polyurethane polishing layer containing polymeric hollow core microparticles and a polyurethane impregnated non-woven subpad.

As is illustrated in the following Examples, the polyglycol and polyglycol derivative CMP methods of the present invention inhibit tungsten dishing in combination with inhibiting erosion of underlying TEOS and further inhibits corrosion rate.

Example 1

Slurry Formulations

The chemical mechanical polishing compositions of this Example were prepared by combining the components in the amounts listed in Table 1 with the balance being DI water and adjusting the pH of the compositions to the final pH listed in Table 1 with 45 wt % potassium hydroxide.

TABLE 1

| Slurry # | Abrasive[1] (wt %) | PEG (Mw) | PEG (ppm) | PSS[2] (ppm) | Fe(NO$_3$)$_3$ (ppm) | Malonic Acid (ppm) | H$_2$O$_2$ (wt %) | pH |
|---|---|---|---|---|---|---|---|---|
| CS-1 | 2 | — | — | — | 362 | 137 | 2 | 2.3 |
| PS-1 | 2 | 1000 | 800 | — | 362 | 137 | 2 | 2.3 |
| PS-2 | 2 | 200 | 200 | — | 362 | 137 | 2 | 2.3 |
| PS-3 | 2 | 10,000 | 200 | 600 | 362 | 137 | 2 | 2.3 |
| PS-4 | 2 | 10,000 | 800 | 2400 | 362 | 137 | 2 | 2.3 |
| PS-5 | 2 | 1000 | 200 | 600 | 362 | 137 | 2 | 2.3 |
| PS-6 | 2 | 1000 | 800 | 2400 | 362 | 137 | 2 | 2.3 |

[1]KLEBOSOL ™ 1598-B25 (—) zeta potential abrasive slurry manufactured by AZ Electronics Materials, available from The Dow Chemical Company; and
[2]Poly(3,4-ethylenedioxythiophene)-poly(styrenesulfonate), Mw = 7000 available from SIGMA-ALDRICH ®.

Example 2

Corrosion Rate Performance of Polyethylene Glycol CMP Slurries

The corrosion tests were carried out by immersing W blanket wafers (1 cm×4 cm) in 15 g slurry samples. The W wafers were removed from tested slurries after 10 min. The solutions were subsequently centrifuged for 20 min at 9,000 rpm to remove slurry particles. The supernatant was analyzed by ICP-OES to determine the amount of tungsten by weight. The corrosion rate (Å/min) was converted from the W mass assuming an etching wafer surface area of 4 cm$^2$. The results of the corrosion tests are in Table 2.

TABLE 2

| Slurry # | W Corrosion Rate (Å/min) |
|---|---|
| CS-1 | 25 |
| PS-1 | 17 |
| PS-2 | 23 |
| PS-3 | 5 |
| PS-4 | 9 |
| PS-5 | 8 |
| PS-6 | 16 |

The results of the corrosion rate tests showed that the chemical mechanical polishing slurries containing the polyethylene glycol and the combination of the polyethylene glycol and PSS effectively reduced the corrosion on W containing wafers better than the control slurry (CS-1).

Example 3

Slurry Formulations

The chemical mechanical polishing compositions of this Example were prepared by combining the components in the amounts listed in Table 3 with the balance being DI water and adjusting the pH of the compositions to the final pH listed in Table 3 with 45 wt % potassium hydroxide.

TABLE 3

| Slurry # | Abrasive[1] (wt %) | PEG[3], Mw = 200 (ppm) | Fe(NO$_3$)$_3$ (ppm) | Malonic Acid (ppm) | H$_2$O$_2$ (wt %) | pH |
|---|---|---|---|---|---|---|
| CS-2 | 2 | — | 362 | 137 | 2 | 2.3 |
| PS-7 | 2 | 50 | 362 | 137 | 2 | 2.3 |
| PS-8 | 2 | 200 | 362 | 137 | 2 | 2.3 |
| PS-9 | 2 | 400 | 362 | 137 | 2 | 2.3 |
| PS-10 | 2 | 600 | 362 | 137 | 2 | 2.3 |

[1]KLEBOSOL ™ 1598-B25 (—) zeta potential abrasive slurry manufactured by AZ Electronics Materials, available from The Dow Chemical Company;
[3]Available from SIGMA-ALDRICH ®.

Example 4

Chemical Mechanical Polishing—Dishing and Erosion Performance of Polyethylene Glycol CMP Slurry The polishing experiments were performed on 200 mm blanket wafers installed on an Applied Materials 200 mm MIRRA® polishing machine. The polishing removal rate experiments were performed on 200 mm blanket 15 kÅ-thick TEOS sheet wafers plus W, Ti, and TiN blanket wafers available from Silicon Valley Microelectronics. All polishing experiments were performed using an IC1010™ polyurethane polishing pad paired with an SP2310 subpad (commercially available from Rohm and Haas Electronic Materials CMP Inc.) with a typical down pressure of 21.4 kPa (3.1 psi), a chemical mechanical polishing composition flow rate of 125 mL/min, a table rotation speed of 80 rpm and a carrier rotation speed of 81 rpm unless specified otherwise. A Kinik PDA33A-3 diamond pad conditioner (commercially available from Kinik Company) was used to dress the polishing pad. The polishing pad was broken in with the conditioner using a down force of 9.0 lbs (4.1 kg) for 15 minutes and 7.0 lbs (3.2 kg) for 15 minutes at 80 rpm (platen)/36 rpm (conditioner). The polishing pad was further conditioned ex-situ prior to polishing using a down force of 7 lbs (3.2 kg) for 24 seconds. The TEOS erosion depths were determined by measuring the film thickness before and after polishing using a KLA-Tencor FX200 metrology tool. The W removal and dishing rates were determined using a KLA-Tencor RS100C metrology tool. The wafers had varying standard line width features as shown in Tables 4A and 4B. In the tables of this example the numerator refers to W and the denominator refers to TEOS.

TABLE 4A

| Slurry # | 100/100 μm dishing (Å) | 100/100 μm erosion (Å) | 50/50 μm dishing (Å) | 50/50 μm erosion (Å) | 10/10 μm dishing (Å) | 10/10 μm erosion (Å) |
|---|---|---|---|---|---|---|
| CS-2 | 1520 | 30 | 1270 | 29 | 724 | 266 |
| PS-7 | 1100 | 6 | 1003 | 12 | 577 | 99 |
| PS-8 | 1083 | 4 | 1018 | 12 | 584 | 156 |
| PS-9 | 1373 | 18 | 1213 | 41 | 666 | 277 |
| PS-10 | 1393 | 17 | 1197 | 52 | 657 | 246 |

TABLE 4B

| Slurry # | 7/3 μm dishing (Å) | 7/3 μm erosion (Å) | 9/1 μm dishing (Å) | 9/1 μm erosion (Å) | 0.25/0.25 μm dishing (Å) | 0.25/0.25 μm erosion (Å) |
|---|---|---|---|---|---|---|
| CS-2 | 499 | 698 | 450 | 1143 | 75 | 357 |
| PS-7 | 359 | 450 | 269 | 797 | 263 | 246 |
| PS-8 | 359 | 415 | 263 | 762 | 165 | 252 |
| PS-9 | 424 | 675 | 354 | 1140 | 99 | 273 |
| PS-10 | 423 | 603 | 347 | 975 | 121 | 317 |

Overall the slurries which included polyethylene glycol showed improved performance in inhibiting dishing of the W and reduced erosion of TEOS.

Example 5

W, TEOS Removal Rate and W, TEOS Selectivity

The polishing experiments for W and TEOS removal rates were performed substantially as described in Example 4 using the same apparatus and parameters. The wafers were from Silicon Valley Microelectronics. The results are in Table 5.

TABLE 5

| Slurry # | W RR (Å/min) | TEOS RR (Å/min) | W/TEOS Selectivity |
|---|---|---|---|
| CS-2 | 1654 | 188 | 9 |
| PS-7 | 1832 | 215 | 9 |
| PS-8 | 1760 | 209 | 8 |
| PS-9 | 1812 | 184 | 10 |
| PS-10 | 1790 | 156 | 11 |

The chemical mechanical polishing compositions of the present invention showed good W RR of greater than 1700 Å/min and good W/TEOS selectivity.

Example 6

Slurry Formulations

The chemical mechanical polishing compositions of this Example were prepared by combining the components in the amounts listed in Table 6 with the balance being DI water and adjusting the pH of the compositions to the final pH listed in Table 6 with 45 wt % potassium hydroxide.

TABLE 6

| Slurry # | Abrasive[4] (wt %) | PEG (Mw) | PEG (ppm) | $Fe(NO_3)_3$ (ppm) | Malonic Acid (ppm) | $H_2O_2$ (wt %) | pH |
|---|---|---|---|---|---|---|---|
| CS-3 | 0.6 | — | — | 362 | 137 | 2 | 2.3 |
| PS-11 | 0.6 | 100,000 | 200 | 362 | 137 | 2 | 2.3 |
| PS-12 | 0.6 | 10,000 | 200 | 362 | 137 | 2 | 2.3 |
| PS-13 | 0.6 | 2000 | 200 | 362 | 137 | 2 | 2.3 |
| PS-14 | 0.6 | 200 | 200 | 362 | 137 | 2 | 2.3 |
| PS-15 | 0.6 | 200 | 800 | 362 | 137 | 2 | 2.3 |

[4]FUSO HL-3 (+) zeta potential abrasive slurry manufactured by Fuso Chemical Co., LTD.

Example 7

Corrosion Rate Performance of Polyethylene Glycol CMP Slurries

The corrosion tests were carried out by immersing W blanket wafers (1 cm×4 cm) in 15 g slurry samples. The W wafers were removed from tested slurries after 10 min. The solutions were subsequently centrifuged for 20 min at 9,000 rpm to remove slurry particles. The supernatant was analyzed by ICP-OES to determine the amount of tungsten by weight. The corrosion rate (Å/min) was converted from the W mass assuming an etching wafer surface area of 4 $cm^2$. The results of the corrosion tests are in Table 7.

TABLE 7

| Slurry # | W Corrosion Rate (Å/min) |
|---|---|
| CS-3 | 52 |
| PS-11 | 30 |
| PS-12 | 28 |
| PS-13 | 28 |
| PS-14 | 39 |
| PS-15 | 43 |

The results of the corrosion rate tests showed that the chemical mechanical polishing slurries containing the polyethylene glycols effectively reduced the corrosion on W containing wafers better than the control slurry (CS-3).

Example 8

Slurry Formulations

The chemical mechanical polishing compositions of this Example were prepared by combining the components in the amounts listed in Table 8 with the balance being DI water and adjusting the pH of the compositions to the final pH listed in Table 8 with 45 wt % potassium hydroxide.

TABLE 8

| Slurry # | Abrasive[4] (wt %) | Polysorbitan | Amount (ppm) | $Fe(NO_3)_3$ (ppm) | Malonic Acid (ppm) | $H_2O_2$ (wt %) | pH |
|---|---|---|---|---|---|---|---|
| CS-4 | 0.6 | — | — | 362 | 137 | 2 | 2.3 |
| PS-16 | 0.6 | Monolaurate[5] | 200 | 362 | 137 | 2 | 2.3 |
| PS-17 | 0.6 | Monolaurate[5] | 800 | 362 | 137 | 2 | 2.3 |
| PS-18 | 0.6 | Monopalmitate[6] | 200 | 362 | 137 | 2 | 2.3 |
| PS-19 | 0.6 | Monopalmitate[6] | 800 | 362 | 137 | 2 | 2.3 |
| PS-20 | 0.6 | Monostearate[7] | 200 | 362 | 137 | 2 | 2.3 |
| PS-21 | 0.6 | Monostearate[7] | 800 | 362 | 137 | 2 | 2.3 |

TABLE 8-continued

| Slurry # | Abrasive[4] (wt %) | Polysorbitan | Amount (ppm) | Fe(NO$_3$)$_3$ (ppm) | Malonic Acid (ppm) | H$_2$O$_2$ (wt %) | pH |
|---|---|---|---|---|---|---|---|
| PS-22 | 0.6 | Monooleate[8] | 200 | 362 | 137 | 2 | 2.3 |
| PS-23 | 0.6 | Monooleate[8] | 800 | 362 | 137 | 2 | 2.3 |

[4]FUSO HL-3 (+) zeta potential abrasive slurry manufactured by Fuso Chemical Co., LTD.
[5]Mw = 1228;
[6]Mw = 1277;
[7]Mw = 1309;
[8]Mw = 1310

Example 9

Corrosion Rate Performance of Polysorbitan CMP Slurries

The corrosion tests were carried out by immersing W blanket wafers (1 cm×4 cm) in 15 g slurry samples. The W wafers were removed from tested slurries after 10 min. The solutions were subsequently centrifuged for 20 min at 9,000 rpm to remove slurry particles. The supernatant was analyzed by ICP-OES to determine the amount of tungsten by weight. The corrosion rate (Å/min) was converted from the W mass assuming an etching wafer surface area of 4 cm². The results of the corrosion tests are in Table 9.

TABLE 9

| Slurry # | W Corrosion Rate (Å/min) |
|---|---|
| CS-4 | 52 |
| PS-16 | 68 |
| PS-17 | 38 |
| PS-18 | 32 |
| PS-19 | 33 |
| PS-20 | 35 |
| PS-21 | 39 |
| PS-22 | 26 |
| PS-23 | 31 |

Except for slurry PS-16 the results of the corrosion rate tests showed that the chemical mechanical polishing slurries containing the polysorbitans effectively reduced the corrosion on W containing wafers better than the control slurry (CS-4).

Example 10

Slurry Formulations

The chemical mechanical polishing compositions of this Example were prepared by combining the components in the amounts listed in Table 10 with the balance being DI water and adjusting the pH of the compositions to the final pH listed in Table 10 with 45 wt % potassium hydroxide.

TABLE 10

| Slurry # | Abrasive[4] (wt %) | Polyethyleneglycol Ester[9] | Amount (ppm) | Fe(NO$_3$)$_3$ (ppm) | Malonic Acid (ppm) | H$_2$O$_2$ (wt %) | pH |
|---|---|---|---|---|---|---|---|
| CS-5 | 0.6 | — | — | 362 | 137 | 2 | 2.3 |
| PS-24 | 0.6 | Monostearate, n = 10, q = 16 | 50 | 362 | 137 | 2 | 2.3 |
| PS-25 | 0.6 | Monostearate, n = 10, q = 16 | 100 | 362 | 137 | 2 | 2.3 |
| PS-26 | 0.6 | Monostearate, n = 10, q = 16 | 200 | 362 | 137 | 2 | 2.3 |
| PS-27 | 0.6 | Monostearate, n = 25, q = 16 | 50 | 362 | 137 | 2 | 2.3 |
| PS-28 | 0.6 | Monostearate, n = 25, q = 16 | 100 | 362 | 137 | 2 | 2.3 |
| PS-29 | 0.6 | Monostearate, n = 25, q = 16 | 200 | 362 | 137 | 2 | 2.3 |
| PS-30 | 0.6 | Monostearate, n = 45, q = 16 | 50 | 362 | 137 | 2 | 2.3 |
| PS-31 | 0.6 | Monostearate, n = 45, q = 16 | 100 | 362 | 137 | 2 | 2.3 |
| PS-32 | 0.6 | Monostearate, n = 45, q = 16 | 200 | 362 | 137 | 2 | 2.3 |
| PS-33 | 0.6 | Monododecyl, n = 25, q = 11 | 50 | 362 | 137 | 2 | 2.3 |
| PS-34 | 0.6 | Monododecyl, n = 25, q = 11 | 100 | 362 | 137 | 2 | 2.3 |
| PS-35 | 0.6 | Monododecyl, n = 25, q = 11 | 200 | 362 | 137 | 2 | 2.3 |

[4]FUSO HL-3 (+) zeta potential abrasive slurry manufactured by Fuso Chemical Co., LTD.
[9]Polyethyleneglycol ester having general formula:
(VII)

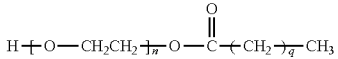

wherein n and q are defined in Table 10.

Example 11

Corrosion Rate Performance of Polyethyleneglycol Ester CMP Slurries

The corrosion tests were carried out by immersing W blanket wafers (1 cm×4 cm) in 15 g slurry samples. The W wafers were removed from tested slurries after 10 min. The solutions were subsequently centrifuged for 20 min at 9,000 rpm to remove slurry particles. The supernatant was analyzed by ICP-OES to determine the amount of tungsten by weight. The corrosion rate (Å/min) was converted from the W mass assuming an etching wafer surface area of 4 cm². The results of the corrosion tests are in Table 11.

TABLE 11

| Slurry # | W Corrosion Rate (Å/min) |
|---|---|
| CS-5 | 68 |
| PS-24 | 84 |
| PS-25 | 44 |
| PS-26 | 47 |
| PS-27 | 31 |
| PS-28 | 52 |
| PS-29 | 62 |
| PS-30 | 34 |
| PS-31 | 54 |
| PS-32 | 58 |
| PS-33 | 38 |
| PS-34 | 67 |
| PS-35 | 69 |

Except for slurries PS-24 and PS-35 the results of the corrosion rate tests showed that the chemical mechanical polishing slurries containing the polyethyleneglycol esters of formula (V) effectively reduced the corrosion on W containing wafers better than the control slurry (CS-5).

What is claimed is:

1. A method of chemical mechanical polishing tungsten, comprising:
   providing a substrate comprising tungsten and a dielectric;
   providing a chemical mechanical polishing composition, consisting of, as initial components:
   water;
   0.01 to 10 wt % of an oxidizing agent;
   50 to 1000 ppm of a polyglycol or polyglycol derivative;
   0.01 to 10 wt % of a colloidal silica abrasive having a (−) negative zeta potential;
   1 to 2,600 ppm of a dicarboxylic acid;
   100 to 1,000 ppm of a source of iron (III) ions;
   optionally, a pH adjusting agent; and,
   optionally, a polystyrenesulfonate;
   wherein the chemical mechanical polishing composition has a pH of 1 to 7;
   providing a chemical mechanical polishing pad, having a polishing surface;
   creating dynamic contact at an interface between the chemical mechanical polishing pad and the substrate; and
   dispensing the chemical mechanical polishing composition onto the polishing surface of the chemical mechanical polishing pad at or near the interface between the chemical mechanical polishing pad and the substrate to remove at least some of the tungsten.

2. The method of claim 1, wherein the chemical mechanical polishing composition provided has a tungsten removal rate of ≥1,000 Å/min with a platen speed of 80 revolutions per minute, a carrier speed of 81 revolutions per minute, a chemical mechanical polishing composition flow rate of 125 mL/min, a nominal down force of 21.4 kPa on a 200 mm polishing machine; and, wherein the chemical mechanical polishing pad comprises a polyurethane polishing layer containing polymeric hollow core microparticles and a polyurethane impregnated non-woven subpad.

3. The method of claim 1, wherein the chemical mechanical polishing composition, provided consists of, as initial components:
   the water;
   0.1 to 5 wt % of the oxidizing agent, wherein the oxidizing agent is hydrogen peroxide;
   50 to 800 ppm of the polyglycol or polyglycol derivative;
   0.05 to 7.5 wt % of the colloidal silica abrasive having a (−) negative zeta potential;
   100 to 1,400 ppm of the dicarboxylic acid;
   150 to 750 ppm of the source of iron (III) ions, wherein the source of iron (III) ions is ferric nitrate;
   optionally, the pH adjusting agent; and,
   optionally, a polystyrenesulfonate;
   wherein the chemical mechanical polishing composition has a pH of 1.5 to 4.5.

4. The method of claim 1, wherein the chemical mechanical polishing composition, provided consists of, as initial components:
   the water;
   0.1 to 3 wt % of the oxidizing agent, wherein the oxidizing agent is hydrogen peroxide;
   100 to 500 ppm of the polyglycol or polyglycol derivative;
   0.1 to 5 wt % of the colloidal silica abrasive having a (−) negative zeta potential;
   120 to 1,350 ppm of the dicarboxylic acid, wherein the dicarboxylic acid is malonic acid;
   200 to 500 ppm of the source of iron (III) ions, wherein the source of iron (III) ions is ferric nitrate;
   optionally, the pH adjusting agent; and,
   optionally, a polystyrenesulfonate;
   wherein the chemical mechanical polishing composition has a pH of 1.5 to 3.5.

* * * * *